(12) United States Patent
Lönnö et al.

(10) Patent No.: US 6,205,943 B1
(45) Date of Patent: Mar. 27, 2001

(54) SHIELDED BOAT HULL OF COMPOSITE MATERIAL WITH SEALED COVER OR THE LIKE AND METHOD OF FASTENING THE SEALING DEVICE

(75) Inventors: Anders Lönnö, Värmdö; Sven-Erik Hellbratt, Karlskrona, both of (SE)

(73) Assignee: Kockums AB, Karlskroma (SE)

( * ) Notice: Subject to any disclaimer, the term of this patent is extended or adjusted under 35 U.S.C. 154(b) by 0 days.

(21) Appl. No.: 09/424,248
(22) PCT Filed: Jun. 2, 1998
(86) PCT No.: PCT/SE98/01046
 § 371 Date: Nov. 30, 1999
 § 102(e) Date: Nov. 30, 1999
(87) PCT Pub. No.: WO98/54049
 PCT Pub. Date: Dec. 3, 1998

(30) Foreign Application Priority Data

May 30, 1997 (SE) .................................................. 9702069

(51) Int. Cl.[7] .................................................. B63B 19/00
(52) U.S. Cl. ........................................ 114/117; 114/201 R
(58) Field of Search ................................... 114/116, 117, 114/173, 201 R, 201 A

(56) References Cited

U.S. PATENT DOCUMENTS

| 4,846,089 | * | 7/1989 | Cedergreen | 114/201 R |
| 4,857,668 | * | 8/1989 | Buonanno | 174/35 GC |
| 4,910,920 | * | 3/1990 | Nichols | 49/485 |

\* cited by examiner

Primary Examiner—Stephen Avila
(74) Attorney, Agent, or Firm—Jacobson, Price, Holman & Stern, PLLC

(57) ABSTRACT

The invention relates to a boat or ship's hull, which is shielded against electronic radiation and comprises a cover (2) or the like for closing a hatch (3) in e.g. the deck (1) of the hull, and a sealing device for electric sealing of the closure of the cover at that part of the hull which surrounds the hatch. The hull and the cover comprise a composite (7, 9) containing fibers of an electrically conductive material, such as carbon fibers. The fibers reach the surfaces of the hull and the cover at the closure, where two sealing members (14, 15) included in the sealing device are fixed by lamination. The sealing members comprise flexible layered elements including fibers of the same kind of material as the fibers of the composite, for instance, textile bands of carbon fibers. The electric seal is kept closed by preferably non-laminated parts (20) of one of said sealing members being pressed against parts (21) of the second sealing member, e.g. by means of an elastic rib (18) which is kept compressed when the cover is closed.

19 Claims, 1 Drawing Sheet

SHIELDED BOAT HULL OF COMPOSITE MATERIAL WITH SEALED COVER OR THE LIKE AND METHOD OF FASTENING THE SEALING DEVICE

FIELD OF THE INVENTION

The invention relates to a boat or ship's hull comprising a composite material with an electrically conductive reinforcement. The hull, preferably of reinforced plastic, is arranged with predetermined properties in respect of shielding against electromagnetic radiation and possibly radar reflection. The hull is formed with hatches which can be closed by means of e.g. covers and doors, provided with electrically conductive seats in respect of the radiation leakage round the hatches. The invention also concerns a method of fastening the seals.

PRIOR-ART TECHNIQUE

Modern warships have to an increasing extent hulls that are built in consideration of radar reflection and shielding against electromagnetic radiation. The former can be intended to direct the radar reflection. The latter can be intended to reduce the emission of revealing signals and to protect the equipment from electronic radiation from outside. On ships with a hull made of a composite material, e.g. a plastic hull, this has been carried out according to prior art by providing the outside of the hull with an electrically conductive layer of e.g. glass fibres, whose surfaces have been coated with a conductive material, e.g. aluminium, in these hulls, aluminium covers contained in aluminium frames are fastened. The seals between the frames and the covers are designed according to prior-art technique for seals between metal parts. A putty containing metal particles has been used between the hull and the frames to obtain a satisfactory electric seal and a connection between the frames and the layer, said connection being unbroken along the fastening of the frames. For, inter alia, the putty to obtain sufficient conductive properties, metal particles of silver have been used. The thus achieved composition of metals, which from the viewpoint of the chain of stress is poor, has been devastating. The aluminium surfaces which have been in contact with the putty, i.e. surfaces of the frames and the fibres of the layer, have corroded significantly, which has caused the connections between the surfaces to be cut off, resulting in leaks in the shielding and great costs of repair and maintenance. This technique also suffers from the drawback that the shielding has not been satisfactory also because of disconnection caused by temperature stress, and therefore it has been necessary to shield much equipment in the ships individually. As a result, the manufacture and maintenance of the ships have become expensive.

DESCRIPTION OF THE INVENTION

Technical Problem

An object of the invention is to provide a boat or ship's hull of a composite material as mentioned by way of introduction, having in any case shielding properties and possibly special radar reflecting properties. The hull is provided with at least one hatch which is closable by means of a device, e.g. a cover, and is sealed against electromagnetic radiation by means of sealing devices and which should have the following properties.

The hull, the cover of the hatch and the electrical seals between this and the hull should be made of materials agreeing with each other.

The seals should be inexpensive to manufacture and maintain and should retain a good function during the life of the ship.

A further object is to provide a method for fastening the sealing devices.

Solution

This object is achieved by the hull and the methods for fastening the sealing device being given the features stated herein. More particularly, the present invention is directed to a shielded boat or ship's hull with a cover, door, or the like for closing a hatch in the hull, and a sealing device for electric sealing of the closure of the cover adjacent to that part of the hull which surrounds the hatch. The hull and the cover comprise a composite having fibers of an electrically conductive material. This composite, at fixing surfaces in the area of the closure between the hull and the cover, reaches the surface of the hull and the cover, respectively. The sealing device includes two sealing members, of which a first sealing member is fixed to the fixing surfaces of the hull side of the closure, and a second sealing member is fixed to the fixing surfaces of the cover side of the closure. Each sealing member comprises a flexible, layered element, by means of which the sealing member is fixed by lamination to said surfaces. Parts of the first sealing member are arranged to be kept pressed against parts of the second sealing member when the cover is closed, and the sealing members include fibers of the same kind of material as the fibers in the composite.

The sealing device may further include a resilient member, the sealing device being adapted such that said resilient member, by compression, holds the parts of the first sealing member pressed against the parts of the second sealing member. The layered element may include a strip of a textile material, e.g., a woven strip or strip-shaped mat of carbon fibers; the strip may be fixed by lamination to the fixing surfaces of the hull or cover side along at least one strip edge. The sealing member of the cover as well as of the hull may further comprise two strips, each strip fixed by lamination to the respective fixing surface along two strip edges, at least one of the strips including a non-laminated raised central band adapted to accommodate the resilient member. In addition, the closure may be an overlap closure with stepped outer limitation of the cover and inner limitation of the hull adjacent to the hatch for forming flat, annular, preferably parallel upper surfaces of steps of the cover and the hull, respectively, with these upper surfaces of the steps comprising fixing surfaces.

The present invention further includes a method for fastening the sealing member to a hull or cover or the like. When the hull or cover is hardened in the fastening areas, surfaces of the conductive fibers of the composite are preferably uncovered at the fixing surfaces by, for instance, grinding. The sealing member is then fixed by lamination to the fixing surfaces by means of a fixing agent, for instance, the same matrix as that of the composite, and excess fixing agent in the laminated material is then pressed away. When the fastening area is wet, the method includes lamination of the fixing surfaces, with excess fixing agent in the laminated material being pressed away.

Warships are to an increasing extent made of a plastic composite with high-strength fibres, e.g. carbon fibres, as reinforcement material. The most important reasons are: The hulls become rigid and strong with a low weight, they obtain a small magnetic signature, small maintenance cost and possibilities of a desired shape of the hull, for instance, flat hull surfaces for the desired radar reflection properties. It is known that if an electrically conducive reinforcement is used, the hull can obtain the desired shielding properties. The reinforcement makes the hull function as a Faraday cage. Certain high strength fibres, especially those made of metal and carbon fibres and certain kinds of ceramic fibres and boron fibres have a good electrical conductivity, which makes them suitable for the purpose. However, since they are used enclosed in an insulating matrix, for instance the plastic, the reinforcement has not been directly accessible to be electrically connected via a seal between the hull and, for instance, a cover. One has tried to solve the problem in different ways, for instance as described above, but the results have proved discouraging.

Experiments have shown that if a member that satisfies certain requirements, such as a strip or the like of a fabric, a tricot or a multiaxial mat, is fixed by lamination to a composite surface comprising electrically conductive fibres, e.g. of the type described above, an electric contact, which is satisfactory for sealing purposes, can be obtained between the member and the conductive fibres of the composite. These fibres may constitute the reinforcement, be included therein as a mixture of carbon fibres and glass fibres, or be particularly added for the purpose. For the above purpose, the member and the composite must contain fibres of the same type of material and in any case, some of the fibres of the member must, before the lamination, have uncovered surfaces. In the preferred embodiment, both the reinforcement of the composite and the textile strip of the sealing device comprise carbon fibres. Of course they may also comprise other materials. Before the lamination, the composite surface, it has hardened, should preferably be ground so as to make a better hold for the plastic and such that surfaces of conductive fibres in the composite, in the above-mentioned embodiment reinforcement fibres, are uncovered. The fixing by lamination is achieved, for instance, by that part of the strip which is to be fixed by lamination being stippled with matrix plastic by means of a brush while the part is held against the composite surface. Excess plastic and air bubbles are then removed by means of a roller. It has previously been considered that the contact would be too poor for the purpose since the plastic used for the lamination is electrically insulating and would enter between the parts and isolate them from each other. Although the distance between the surface and the fibres of the strip could be kept very small during the lamination, capillary action would draw in the highly viscous plastic between the fibres and spoil the contact. The reason why a connection arises in any case has not been clarified, but maybe the plastic, the new matrix material, pulls e.g. the strip into the composite reinforcement as the lamination hardens. The fibre materials will be in such intimate contact with each other as to create a capacitive or a purely mechanical correction. The nature of the contact, however, will be such as to require a certain empirically determined minimum width of the laminated part of the strip transversely of the longitudinal direction thereof, thereby obtaining a sufficient contact surface.

According to the invention, it is suggested that the seal comprise two such members, e.g. strips, laminated on both sides of a cover closure. In the fixing by lamination, the fixing surfaces are not allowed to be covered with, for instance, a part or a gel coat. Such coats are normally used as protection of boat or ship's hulls. There the composite should thus reach the surface. The sealing members according to the invention can be fastened to the hull and the cover whether they have hardened or not.

If the hull or the cover has hardened, it is convenient first to grind off matrix material from the fixing surfaces, thereby uncovering surfaces of reinforcement fibres. Subsequently, the sealing members are fixed by lamination to the fixing surfaces by means of a fixing agent, for example, a matrix material of the same kind as that of the composite. During the lamination, excess fixing material is pressed away, such that the sealing members adjoin the fixing surfaces. This can be carried out in different ways, for instance by means of a roller, vacuum or the like.

If the material of the hull or the cover is still wet, the sealing members are fixed preferably directly in their respective places on the composite by means of a fixing agent, for instance, a matrix material of the same kind as that of the composite. Fixing the sealing member by lamination can then be regarded as part of the manufacture of the composite. Just as when laminating on hardened fixing surfaces, the fixing agent should be forced away so as not unnecessarily to penetrate between the reinforcing material and the sealing member at issue, e.g. mechanically by means of a roller. Also when fixing by wet lamination, excess fixing agent can be pressed away by vacuum which is supplied under a coating applied to the sealing member and the surrounding composite.

If the sealing members suggested according to the invention are fastened in the manner described above, a good electric connection along the closure between the reinforcing material and the sealing members will be obtained. For the hull acting as a Faraday cage to be effective when the cover is closed, the two sealing members must be electrically interconnected along the entire closure. However, very small distances of disconnection can be allowed if they are smaller than a dimension which depends on the wavelength of the radiation that is to be prevented from penetrating the closure.

An electric seal which is satisfactory for the purpose forms when parts of the sealing member of the hull and the cover, respectively, are kept pressed against each other along preferably the entire closure. If, for instance, the strip part surfaces facing each other are kept dry, i.e. free from matrix material or a similar hardening plastic, they have such an elastic quality that the fibre materials of the strips engage each other. The contact points in the interface between the respective strip parts will be so uniformly distributed over the interface and exist in such an amount that a satisfactory contact is achieved. However, also in this case a certain empirically determined minimum width of the contact surface is required.

The compression of the strip parts is accomplished, for instance, by the fact that they are arranged between smooth parallel surfaces that are pressed together or preferably by means of an included member which is yieldable, e.g. resilient. This can be a number of spring elements of metal, e.g. plate springs or helical springs, or an elastic rib, for instance, of expanded polymer or rubber material, which, during closing of the cover, is compressed between surfaces in the hull and the cover. These surfaces are then preferably parallel and extend as a pair of frame-shaped surfaces extending around the cover closure and conforming with each other. The degree of compression can be adjusted by means of a closing device which puts down the cover into the cover frame of the hatch to such an extent as to achieve the correct distance between said surfaces. The rib will then apply a relatively uniformly distributed pressure in the strip parts which can be placed between one of these parallel surfaces and the elastic rib. In the preferred embodiment, the rib is fixed to the surface of the cover, but could just as well be fixed to the surface of the hull. If two ribs are used, they can be fixed each to a surface of the hull and the cover, respectively. The strips are then arranged to be compressed between the ribs. The member can also be yieldable as a device, e.g. formed as a tube, which applies the pressure by means of a gas which is supplied internally, permanently or temporarily.

If the sealing members consist of two strips, these can preferably be laminated along the edges on the respective surfaces, if an elastic rib is used, this can be placed between one of the surfaces and the strip which is formed with a raised central band and which then of course must be much wider than the edge distance of the strip after the lamination. The strip without the rib is laminated along the edges so as to rest in a flat state against its base. The strip with the rib can alternatively be arranged in the form of a loop round the rib, the one strip edge being laminated on the hull or cover surface and the other strip edge on the upper face of the first strip edge. Only one strip edge will then engage the surface.

The invention is not restricted to the conductive material being carbon fibres. The material can be a metal or a metallised fibre. Nor do these devices have to consist of fibres in the form of a fabric, tissue, mat or the like. They can be made of an elastic layer, for instance, a film or cloth of a polymer which comprises fibres of the same material as the reinforcement of the composite. The preferred embodiment shows the sealing of an overlap closure. The invention is equally applicable to other types of closure, for instance an end closure, in this case the preferably parallel surfaces as above extended transversely of the main direction of the deck side-by-side on the same level round the closure. The squeezing of the rib will then be determined by the constructional distance between the surfaces, not by the extent at which the cover is pressed down in the cover frame by closing means.

Although the preferred embodiment shows that the enclosed members, the strips, are fixed by lamination as well as responsible for the connection between themselves, at least one of the members can be divided such that different parts thereof provide for the different functions of the member. Nor do the two strips need to have a non-laminated central portion. The central portion of the flat strip can, for instance, be fixed to the base such that its upper face is still free from fixing material.

Advantages

The invention provides simple means for effective shielding of boat or ship's hulls. The closable hatches of the hull require no extra metal frames and contain no materials that are foreign to the species and that may cause corrosion, temperature stress or be harmful in some other manner.

The electric seal in the closures of the cover and its connection to the hull as such are well suited to each other.

The hull and the seal will for a long time manage without expensive maintenance.

The seals can be manufactured in connection with the manufacture of the rest of the hull, which together with the simple material makes the hull cost-effective.

DESCRIPTION OF THE FIGURES

A preferred embodiment will now be described in more detail with reference to the accompanying Figures, whose reference numerals designate corresponding parts in the Figures.

Preferred Embodiment

Figure 1A:
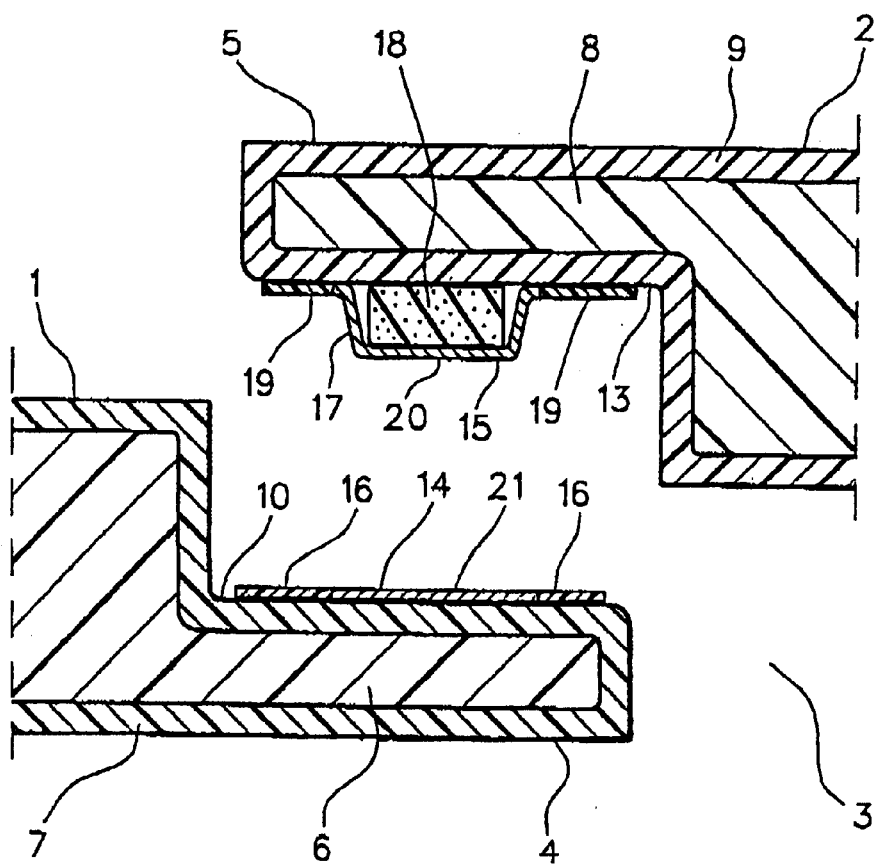
FIG. 1a is a cross-section of a portion of the inventive hull with a cover that is slightly open to clarify the composition of the seal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The Figures illustrate a portion of a horizontal boat deck 1 and part of a cover 2 for closing a rectangular hatch 3 in the deck but may just as well illustrate, for instance, a door in the superstructure of the hull. The deck is defined against the hatch by an integrated cover frame 4, which together with the outer rim 5 of the rectangular cover is designed as an overlap closure, which is identical for all four sides of the hatch. The cover is kept closed against the frame by vertically adjustable closing means (not shown in the Figures), hinges on one of the sides and bolts on the opposite side of the hatch.

The cover frame 4 constitutes the terminal portion of the deck against the hatch 3 and is, like the rest of the deck, made up of a core 6 of a porous material, and a layer 7 of a carbon fibre reinforced plastic composite on the outside of this core. The cover is designed in the same manner, having a core 8 and a carbon fibre reinforced composite layer 9 on the outside of the core. The thickness of the deck 1 is constant up to the frame, where it decreases step-by-step to less than half of its previous dimension. The transition from the upper face of the deck to the upper surface 10 of the step extending in parallel with the main direction of the deck, is, like the end wall of the frame, perpendicular to said main direction.

The outer rim of the cover is of a cross-section which is the same as the one shown for the frame, but which in the plane of the Figure is rotated through half a turn. When the cover is closed, the outer rim 5 is displaced to such an extent inwards to the centre of the hatch as to form a Z-shaped gap, whose vertical parts 11 have a thickness which depends on the desired play between the closed cover and the deck. The horizontal part of the gap is adapted to provide a space 12 for the electric seal included in the invention. The space is limited downwards by the upper surface 10 of the step of the frame and upwards by the upper surface 13 of the step of the cover, which corresponds to the upper surface of the step of the frame. Said upper surfaces then form two rectangular annular frame-shaped flat surfaces, arranged concentrically and in parallel, at a distance from each other corresponding to the height of the space 12.

The seal consists of two parts, a lower flat part 14 and an upper elastic part 15 which are arranged on the upper surface 10 of the step of the frame and the upper surface 13 of the step of the cover, respectively. The lower flat part consists of four band-shaped strips with stay edges of carbon fibre fabric. The strips are cut off straight at an angle of 45° at the ends, where they are sewn together by means of a carbon fibre thread to a frame which with a distance allowance matches the upper surface of the step of the frame. The strips are at their edges 16 fixed by lamination as described in the introductory part by means of the same fluid matrix material as is used for the hull. Before the lamination, grinding is carried out on those parts of the upper surface of the step to which the edges will be fixed. By the grinding operation, the surfaces of the reinforcement fibres are uncovered, thereby establishing a good contact in the connection.

The upper elastic part 15 consists of four band-shaped strips 17, also having stay edges, of a preferably yieldable carbon fibre fabric, and four ribs 18 of an elastic material, e.g. a possibly expanded elastomer, such as a foamed nitrile rubber. The ribs are cut off straight at an angle of 45° at the ends, where they are glued together to form a frame. The strips are cut off at the ends such that after being sewn together there by means of carbon fibre thread, they form a casing which accommodates the rib frame between the casing and the upper surface of the step of the cover when the strips, as described above, have been fixed by lamination along edges 19 projecting from the casing on the upper surface of said step. The ribs and the strips are designed such that when the cover is closed, the filled strip part 20 of the upper elastic part will be pressed against the non-laminated frame-shaped central area 21 of the lower flat part. The height of the ribs is selected according to the height of the space 12 and the hardness of the rib material, thereby obtaining the designed compression pressure.

Function of the Embodiment

Figure 1B:
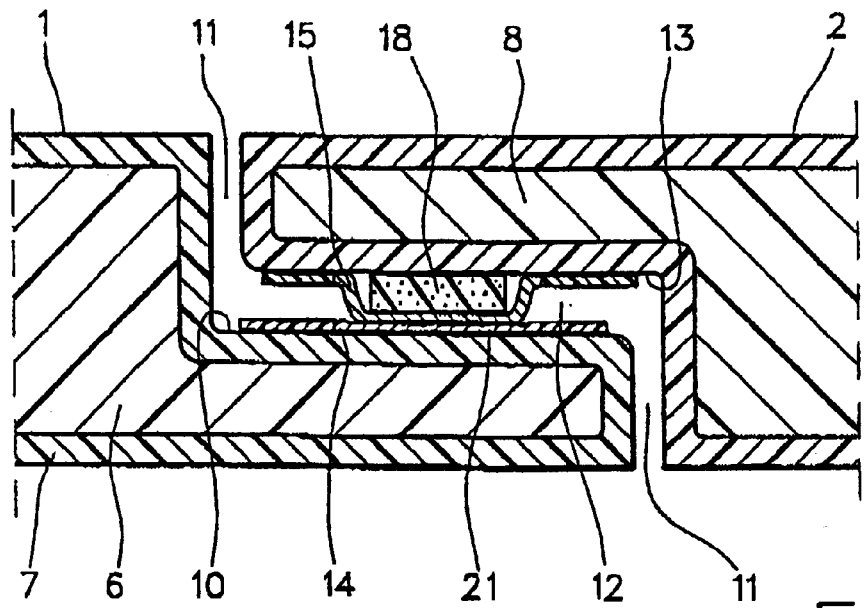
FIG. 1b is a cross-section of the hull portion with the cover closed.

The two sealing parts 14 and 15 are fixed by lamination to the respective upper surfaces 10, 13 of the steps at two edges each, each edge having such a width as to form a sufficiently large contact surface between the conductive reinforcement of the hull and the conductive seal parts. By the doubling of the lamination of each strip, good safety is ensured in the electric connection. When the cover is closed (see FIG. 1b), a pressure is achieved by the compression of the ribs between the seal parts which, along with the nature of these and the size of their common contact surface, provide for a good electric contact between the parts. The described embodiment of these in the form of frames with their centrally extending annular contact surfaces ensures a reliable seal along the entire closure, also in the corners of the hatch that may be sensitive to radiation leakage. Aging and other changes can be counteracted by means of the above-mentioned adjustable closing means for the cover. A rib absorbing radar radiation can be inserted into that part of the gap 11 which adjoins the upper face of the deck.

The invention being thus described, it will be obvious that the same may be varied in many ways. Such variations are not to be regarded as a departure from the spirit and scope of the invention, and all such modifications as would be recognized by one skilled in the art are intended to be included within the scope of the following claims.

What is claimed is:

1. A sealing device for electrically sealing a hull in a closure area having a removable cover for closing a hatch, comprising:
    a first fixing surface on said hull in said closure area, said hull being made of a composite including fibers of an electrically conductive material;
    a second fixing surface on said cover in said closure area, said cover being made of a composite including fibers of the same kind of electrically conductive material as in said hull;
    a first sealing member fixed to the first fixing surface on said hull, said first sealing member including fibers of the same kind of electrically conductive material as in said hull;
    a second sealing member fixed to the second fixing surface on said cover, said second sealing member including fibers of the same kind of electrically conductive material as in said cover; and
    an exposed surface of said first sealing member being pressed against a surface of said second sealing member when the cover is closed, and said first and second sealing members being separated from one another when the cover is opened.

2. The sealing device as set forth in claim 1, further comprising a resilient member, adjacent an inner surface of one of said first and second sealing members, for compressing said first sealing member against said second sealing member when the cover is closed.

3. The sealing device as set forth in claim 1, wherein each of said first and second sealing members is fixed by lamination to a respective fixing surface using a fixing agent.

4. The sealing device as set forth in claim 1, wherein said fibers are carbon fibers.

5. The sealing device as set forth in claim 1, wherein at least one of said first and second sealing members includes a flexible layered element.

6. The sealing device as set forth in claim 5, wherein said flexible layered element includes a strip of textile material of carbon fibers fixed by lamination along at least one strip edge to a respective one of said first and second fixing surfaces.

7. The sealing device as set forth in claim 2, wherein each of said first and second sealing members includes a strip of textile material of carbon fibers fixed by lamination along two strip edges to said first and second fixing surfaces, respectively, at least one of said strips having a non-laminated raised central band adapted to accommodate said resilient member.

8. The sealing device as set forth in claim 1 wherein the closure area is an overlap closure with stepped outer limitation of the cover and stepped inner limitation of the hull adjacent the hatch for forming flat, annular, substantially parallel adjoining surfaces of steps of the cover and the hull, respectively, said steps including said first and second fixing surfaces.

9. The sealing device as set forth in claim 1, wherein said first and second fixing surfaces are hardened and the fibers of said electrically conductive material of said hull and said cover are exposed by grinding, each sealing member being fixed by lamination to a respective fixing surface using a fixing agent.

10. The sealing device as set forth in claim 9, wherein said fixing agent has a same matrix as that of the composite of said respective fixing surface.

11. The sealing device as set forth in claim 1, wherein at least one of said first and second fixing surfaces is wet and a respective sealing member is fixed by lamination thereto using a fixing agent having a same matrix as that of the composite of said respective fixing surface.

12. A sealing device for electrically sealing a hull in a closure area having a hatch and a removable cover, comprising:
    a first fixing surface on said hull in said closure area, said hull being made of a composite including fibers of an electrically conductive material which are exposed at said first fixing surface;
    A second fixing surface on said cover in said closure area, said cover being made of a composite including fibers of the same kind of electrically conductive material as in said hull and being exposed at said second fixing surface, wherein said closure area includes an overlap closure with stepped outer limitation of the cover and stepped inner limitation of the hull adjacent the hatch for forming flat, annular, adjoining surfaces of steps of the cover and the hull, respectively, said step surfaces including said first and second fixing surfaces;

a first sealing member laminated to the first fixing surface on said hull by a flexible layered element having fibers of the same kind of electrically conductive material as in said hull;

a second sealing member laminated to the second fixing surface on said cover by a flexible layered element having fibers of the same kind of electrically conductive material as in said cover; and wherein a part of said first sealing member is pressed against a part of said second sealing member when the cover is closed.

13. The sealing device as set forth in claim 12, wherein the fibers are carbon fibers.

14. The sealing device as set forth in claim 12, wherein each of said first and second sealing members includes a woven strip of textile material of carbon fibers fixed by lamination along at least one strip edge to said first and second fixing surfaces, respectively.

15. The sealing device as set forth in claim 12, wherein each of said first and second sealing members includes a strip of textile material of carbon fibers fixed by lamination along two strip edges to said first and second fixing surfaces, respectively, at least one of said strips having a non-laminated raised central band adapted to accommodate a resilient core.

16. In a shielded hull having a hatch with a cover, both the hatch and the cover being made of a composite and each having fibers of the same kind of electrically conductive material, a method for fastening a sealing device for electrically sealing the closure of the cover adjacent that part of the hull which surrounds the hatch along first and second fixing surfaces, comprising:

laminating a first sealing member to said first fixing surface on said hull by means of a fixing agent, said first sealing member having fibers of the same kind of electrically conductive material as in said hull;

laminating a second sealing member to said second fixing surface on said cover by means of a fixing agent, said second sealing member having fibers of the same kind of electrically conductive material as in said cover; and pressing away excess fixing agent in the laminated material.

17. The method according to claim 16, further comprising, when said hull has hardened and before the first laminating step, the step of grinding said first fixing surface to expose portions of said fibers of electrically conductive material within said hull.

18. The method according to claim 14, further comprising, when said cover has hardened and at least before the second laminating step, the step of grinding said second fixing surface to expose portions of said fibers of electrically conductive material within said cover.

19. The method according to claim 16, wherein said fixing agent has a same matrix as that of the composite of the fixing surface to which said fixing agent is bonded.

* * * * *